(12) United States Patent
Wijckmans et al.

(10) Patent No.: US 8,913,228 B2
(45) Date of Patent: Dec. 16, 2014

(54) LITHOGRAPHIC APPARATUS AND DEVICE MANUFACTURING METHOD

(75) Inventors: Maurice Wijckmans, Eindhoven (NL); Martinus Agnes Willem Cuijpers, Veldhoven (NL); Martinus Hendrikus Antonius Leenders, Rhoon (NL); Frits Van Der Meulen, Einhoven (NL); Joost Jeroen Ottens, Veldhoven (NL); Theodorus Petrus Maria Cadee, Vlierden (NL); Frederik Eduard De Jong, Eindhoven (NL); Wilhelmus Franciscus Johannes Simons, Beesel (NL); Edwin Augustinus Matheus Van Gompel, Veldhoven (NL); Martin Frans Pierre Smeets, Veldhoven (NL); Rob Jansen, Veldhoven (NL); Gerardus Adrianus Antonius Maria Kusters, Eindhoven (NL); Martijn Van Baren, Joure (NL)

(73) Assignee: ASML Netherlands B.V., Veldhoven (NL)

( * ) Notice: Subject to any disclaimer, the term of this patent is extended or adjusted under 35 U.S.C. 154(b) by 1723 days.

(21) Appl. No.: 11/730,749

(22) Filed: Apr. 3, 2007

(65) Prior Publication Data

US 2007/0242245 A1    Oct. 18, 2007

Related U.S. Application Data

(60) Provisional application No. 60/789,604, filed on Apr. 6, 2006.

(51) Int. Cl.
*G03B 27/58* (2006.01)
*G03F 7/20* (2006.01)
*F16L 55/053* (2006.01)

(52) U.S. Cl.
CPC ........... *G03F 7/70875* (2013.01); *F16L 55/053* (2013.01); *G03F 7/70341* (2013.01); *G03F 7/70783* (2013.01)
USPC ............................................... 355/72; 355/53

(58) Field of Classification Search
CPC ............. F16L 55/02718; F16L 55/053; F02M 37/0041; G03F 7/70716; G03F 7/70341; G03F 7/70783; G03F 7/70875
USPC ................. 355/30, 53, 72; 417/31, 44.2, 540; 138/31

See application file for complete search history.

(56) References Cited

U.S. PATENT DOCUMENTS

| 4,509,852 A | 4/1985 | Tabarelli et al. ................. 355/30 |
| 5,063,582 A | 11/1991 | Mori et al. |

(Continued)

FOREIGN PATENT DOCUMENTS

| EP | 0357423 A | 3/1990 |
| EP | 1 420 300 A2 | 5/2004 |

(Continued)

OTHER PUBLICATIONS

Austrian Search Report and Written Opinion issued on Oct. 17, 2008 in Singapore Application No. 200702551-3.

(Continued)

*Primary Examiner* — Mesfin T Asfaw
(74) *Attorney, Agent, or Firm* — Pillsbury Winthrop Shaw Pittman LLP

(57) ABSTRACT

A lithographic apparatus is disclosed that is arranged to project a pattern from a patterning device onto a substrate, the lithographic apparatus has a substrate table configured to hold a substrate. The substrate table includes a conditioning system configured to hold a conditioning fluid and to condition the substrate table. The conditioning system includes a pressure damper that is in fluid communication with the conditioning system and is arranged to dampen a pressure variation in the conditioning system.

39 Claims, 4 Drawing Sheets

(56) References Cited

U.S. PATENT DOCUMENTS

| | | | |
|---|---|---|---|
| 5,231,291 A | 7/1993 | Amemiya et al. | |
| 5,413,167 A | 5/1995 | Hara et al. | |
| 5,577,552 A * | 11/1996 | Ebinuma et al. | 165/296 |
| 5,928,390 A | 7/1999 | Yaegashi et al. | |
| 6,202,492 B1 | 3/2001 | Ohsaki | |
| 6,211,946 B1 | 4/2001 | Ohtomo et al. | |
| 6,478,052 B1 | 11/2002 | Conley et al. | |
| 7,288,864 B2 | 10/2007 | Eaton et al. | |
| 7,352,434 B2 | 4/2008 | Streefkerk et al. | |
| 7,486,381 B2 | 2/2009 | Streefkerk et al. | |
| 7,545,478 B2 | 6/2009 | Box et al. | |
| 2001/0043314 A1 * | 11/2001 | Ota | 355/30 |
| 2002/0000029 A1 | 1/2002 | Emoto | |
| 2002/0015139 A1 | 2/2002 | Hara | |
| 2003/0010847 A1 * | 1/2003 | Curran et al. | 239/585.1 |
| 2004/0134550 A1 * | 7/2004 | Treusch et al. | 138/44 |
| 2004/0136494 A1 | 7/2004 | Lof et al. | 378/34 |
| 2004/0207824 A1 | 10/2004 | Lof et al. | 355/30 |
| 2005/0018157 A1 | 1/2005 | Box et al. | |
| 2005/0088634 A1 * | 4/2005 | Kosugi et al. | 355/30 |
| 2005/0248739 A1 | 11/2005 | Box et al. | |
| 2005/0254028 A1 | 11/2005 | Box | |

FOREIGN PATENT DOCUMENTS

| | | |
|---|---|---|
| EP | 1496399 A | 1/2005 |
| EP | 1 420 300 A3 | 8/2005 |
| JP | 02-067714 | 3/1990 |
| JP | 03-003222 | 1/1991 |
| JP | 03-062920 | 3/1991 |
| JP | 09-205047 | 8/1997 |
| JP | 2001-297967 | 10/2001 |
| JP | 2004-095993 A | 3/2004 |
| JP | 2004-343114 | 12/2004 |
| JP | 2005-322907 | 11/2005 |
| JP | 2005-340815 | 12/2005 |
| WO | WO 99/49504 | 9/1999 |
| WO | WO 03079418 A1 * | 9/2003 |

OTHER PUBLICATIONS

European Search Report issued on Oct. 24, 2008 in European Application No. 07251323.7.

Taiwan Office Action dated Oct. 11, 2011 in corresponding Taiwan Patent Application No. 096112190.

Japanese Office Action mailed Feb. 1, 2011 in Japanese Patent Application No. 2007-090110.

Chinese First Office Action issued Apr. 14, 2010 in corresponding Chinese Application No. 200710092076.1.

Chinese Second Office Action issued Sep. 30, 2010 in corresponding Chinese Application No. 200710092076.1.

* cited by examiner

Fig. 2
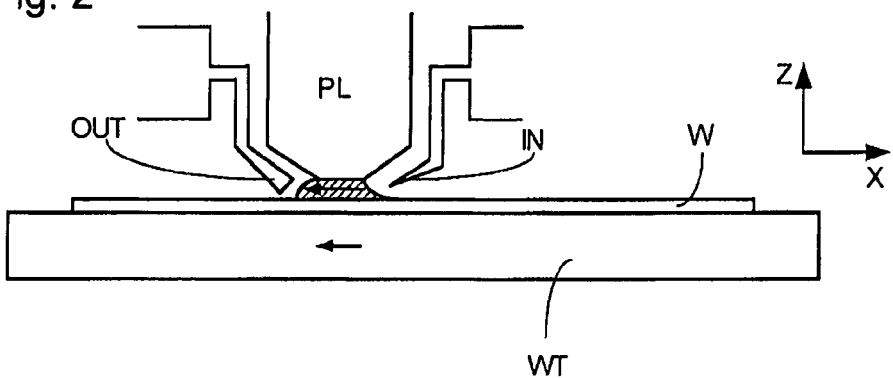
Fig. 3
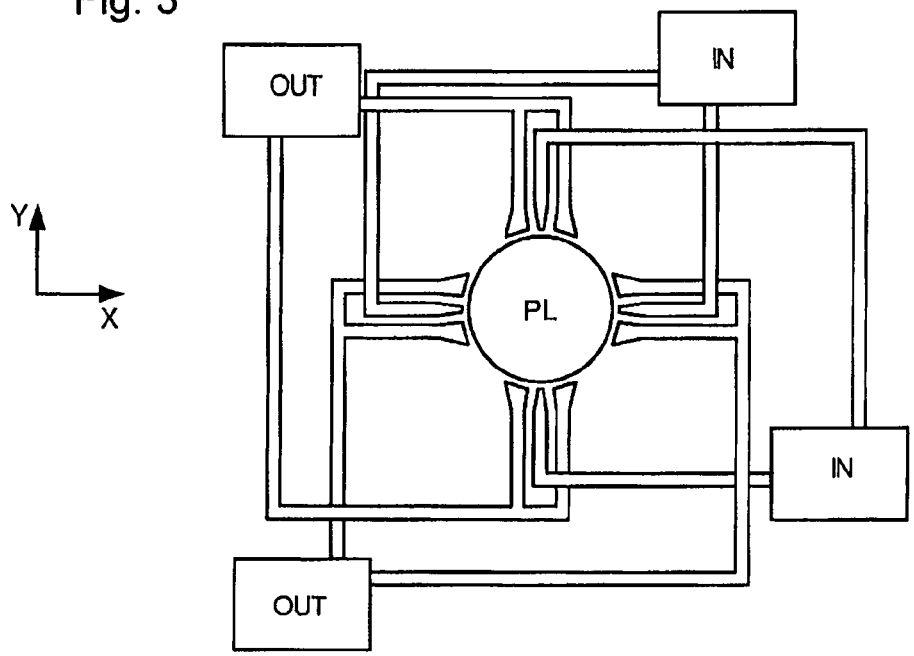
Fig. 4
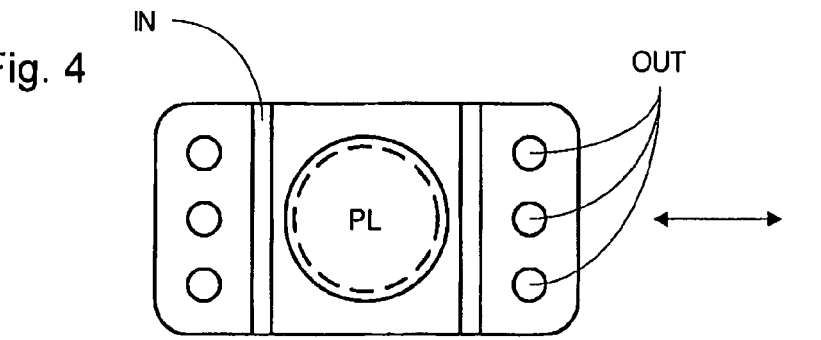
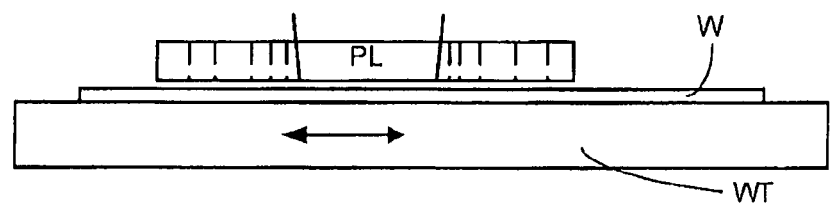

Fig. 5
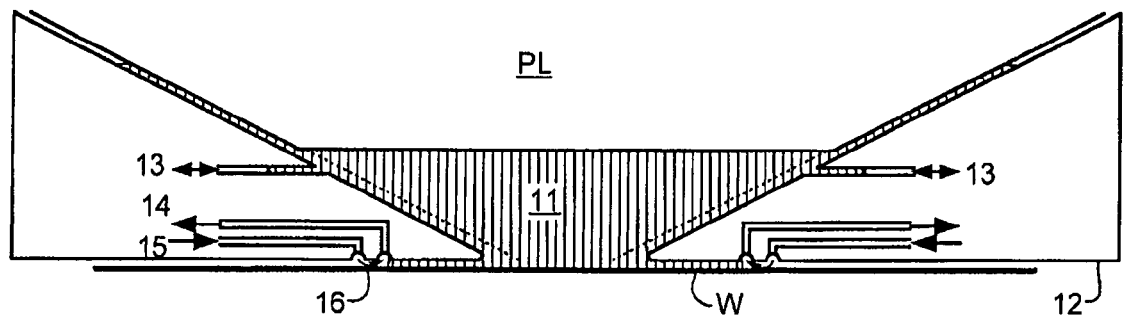
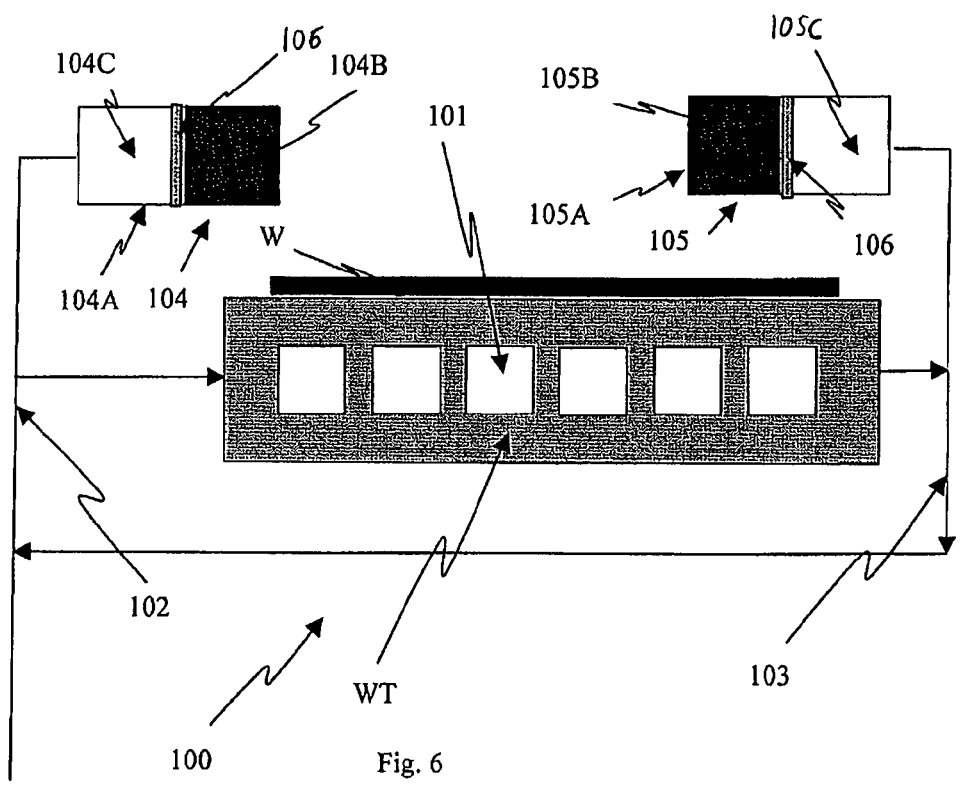
Fig. 6
Fig. 9
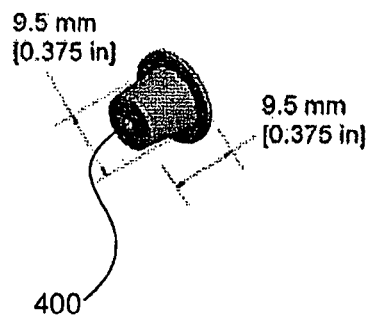

LITHOGRAPHIC APPARATUS AND DEVICE MANUFACTURING METHOD

CROSS-REFERENCE TO RELATED APPLICATIONS

This application claims the benefit of priority from U.S. Provisional Patent Application Ser. No. 60/789,604, filed on Apr. 6, 2006 and currently pending, the entire contents of which are incorporated herein by reference.

FIELD

The present invention relates to a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852) means that there is a large body of liquid that should be accelerated during a scanning exposure. This may require additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication WO 99/49504. As illustrated in FIGS. 2 and 3, liquid is supplied by at least one inlet IN onto the substrate W, preferably along the direction of movement of the substrate relative to the final element, and is removed by at least one outlet OUT after having passed under the projection system PL. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2, the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another immersion lithography solution with a localized liquid supply system solution which has been proposed is to provide the liquid supply system with a liquid confinement structure which extends along at least a part of a boundary of the space between the final element of the projection system and the substrate table. Such a solution is illustrated in FIG. 5. The liquid confinement structure is substantially stationary relative to the projection system in the XY plane though there may be some relative movement in the Z direction (in the direction of the optical axis). In an embodiment, a seal is formed between the liquid confinement structure and the surface of the substrate and may be a contactless seal such as a gas seal.

The liquid confinement structure 12 at least partly contains liquid in the space 11 between a final element of the projection system PL and the substrate W. A contactless seal 16 to the substrate may be formed around the image field of the projection system so that liquid is confined within the space between the substrate surface and the final element of the projection system. The space is at least partly formed by the liquid confinement structure 12 positioned below and surrounding the final element of the projection system PL. Liquid is brought into the space below the projection system and within the liquid confinement structure 12 by liquid inlet 13 and may be removed by liquid outlet 13. The liquid confinement structure 12 may extend a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular, though this need not be the case.

The liquid is contained in the space 11 by a gas seal 16 which, during use, is formed between the bottom of the liquid confinement structure 12 and the surface of the substrate W.

The gas seal is formed by gas, e.g. air or synthetic air but, in an embodiment, $N_2$ or another inert gas, provided under pressure via inlet 15 to the gap between liquid confinement structure 12 and substrate and extracted via outlet 14. The overpressure on the gas inlet 15, vacuum level on the outlet 14 and geometry of the gap are arranged so that there is a high-velocity gas flow inwards that confines the liquid. Those inlets/outlets may be annular grooves which surround the space 11 and the flow of gas 16 is effective to contain the liquid in the space 11. Such a system is disclosed in United States patent application publication no. US 2004-0207824.

In European patent application publication no. EP 1420300 and United States patent application publication no. US 2004-0136494, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

One of the challenges of immersion lithography is the thermal conditioning of the substrate. Evaporation of residual liquid may result in thermal loads applied on the substrate and substrate table. More specifically, evaporation of residual liquid may extract heat from the substrate and substrate table that in turn may result in a substrate shape deformation due to deformation of the substrate table on which the substrate is held. As a solution, active cooling of the substrate table may be used to compensate for the heat load. For this purpose, the substrate table may be provided with one or more conditioning channels carrying a conditioning fluid. Such a channel is supplied with conditioning fluid by means of a supply device that transports conditioning fluid to the conditioned substrate table. Fluid may be transported away from the conditioned substrate table by means of a removal device.

SUMMARY

During operation of the lithographic apparatus, the substrate table is accelerated and consequently the conditioning fluid, inside the supply device, the removal device and/or the substrate table, experiences an acceleration and consequently a change in fluid pressure. This change in pressure in the conditioning fluid is directly transferred to the conditioning channel in the substrate table and thus to the substrate table.

It is desirable, for example, to provide a lithographic apparatus in which a measure is taken to decrease the effect of a pressure change in the conditioning fluid on the substrate table.

According to an aspect of the invention, there is provided a lithographic apparatus arranged to project a pattern from a patterning device onto a substrate. The lithographic apparatus includes an object that comprises a conditioning system configured to hold a conditioning fluid and to condition the object. The conditioning system comprises a pressure damper in fluid communication with the conditioning system and arranged to dampen a pressure variation in the conditioning system and/or isolate the conditioning fluid within the object from conditioning fluid outside of the object.

According to an aspect of the invention, there is provided a lithographic apparatus arranged to project a pattern from a patterning device onto a substrate. The lithographic apparatus comprises a substrate table configured to hold a substrate. The substrate table comprises a conditioning system configured to hold a conditioning fluid and to condition the substrate table. The conditioning system comprises a conditioning fluid supply device configured to transport conditioning fluid to the substrate table, a conditioning fluid removal device configured to transport conditioning fluid away from the substrate table, a first pressure damper in fluid communication with the supply device and a second pressure damper in fluid communication with the removal device. The pressure dampers are arranged to dampen a pressure variation in the conditioning system and/or isolate the conditioning fluid in the substrate table from the conditioning fluid outside of the substrate table.

According to an aspect of the invention, there is provided a lithographic apparatus arranged to project a pattern from a patterning device onto a substrate. The lithographic apparatus comprises a substrate table configured to hold a substrate, and an object comprising a conditioning system configured to condition the object by pumping a conditioning fluid around a loop using a pump mounted to the object.

According to an aspect of the invention, there is provided a lithographic apparatus arranged to project a pattern from a patterning device onto a substrate. The lithographic apparatus comprises a substrate table configured to hold a substrate, and an object comprising a conditioning system configured to condition the object. The conditioning system comprises an active pressure damper, a pressure sensor for measuring the pressure of the conditioning fluid, and a controller configured to drive the active pressure damper on the basis of signals from the pressure sensor. The active pressure damper is configured to apply a substantially equal and opposite pressure to a pressure variation measured by the pressure sensor.

According to an aspect of the invention, there is provided a lithographic apparatus arranged to project a pattern from a patterning device onto a substrate. The lithographic apparatus comprises a substrate table configured to hold a substrate, and an object comprising a conditioning system configured to condition the object by pumping a conditioning fluid around a flow path in the object. The flow path comprises at least one flow restriction.

According to an aspect of the invention, there is provided a lithographic apparatus arranged to project a pattern from a patterning device onto a substrate. The lithographic apparatus comprises a substrate table configured to hold a substrate. The substrate table comprises a conditioning system configured to condition the substrate table by pumping a conditioning fluid through the substrate table. The conditioning system comprises two pumps in a flow path of conditioning fluid. A first of the two pumps is positioned in the flow path at a position in which the conditioning fluid substantially flows towards the substrate table. A second of the two pumps is positioned in the flow path at a position in which the conditioning fluid substantially flows away from the substrate table.

According to an aspect of the invention, there is provided a method of manufacturing a device. The method comprises projecting a patterned beam of radiation onto a target portion of a substrate, conditioning the substrate using a conditioning system, and dampening a pressure variation in the conditioning system.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic apparatus;

FIG. 4 depicts a further liquid supply system for use in a lithographic apparatus;

FIG. 5 illustrates, in cross-section, a barrier member with a gas seal formed between the barrier member and a substrate;

FIG. 6 schematically illustrates a fluid conditioned substrate table with two pressure dampers according to an embodiment of the invention;

FIG. 9 is a perspective view of a flow restrictor.

DETAILED DESCRIPTION

Figure 1:
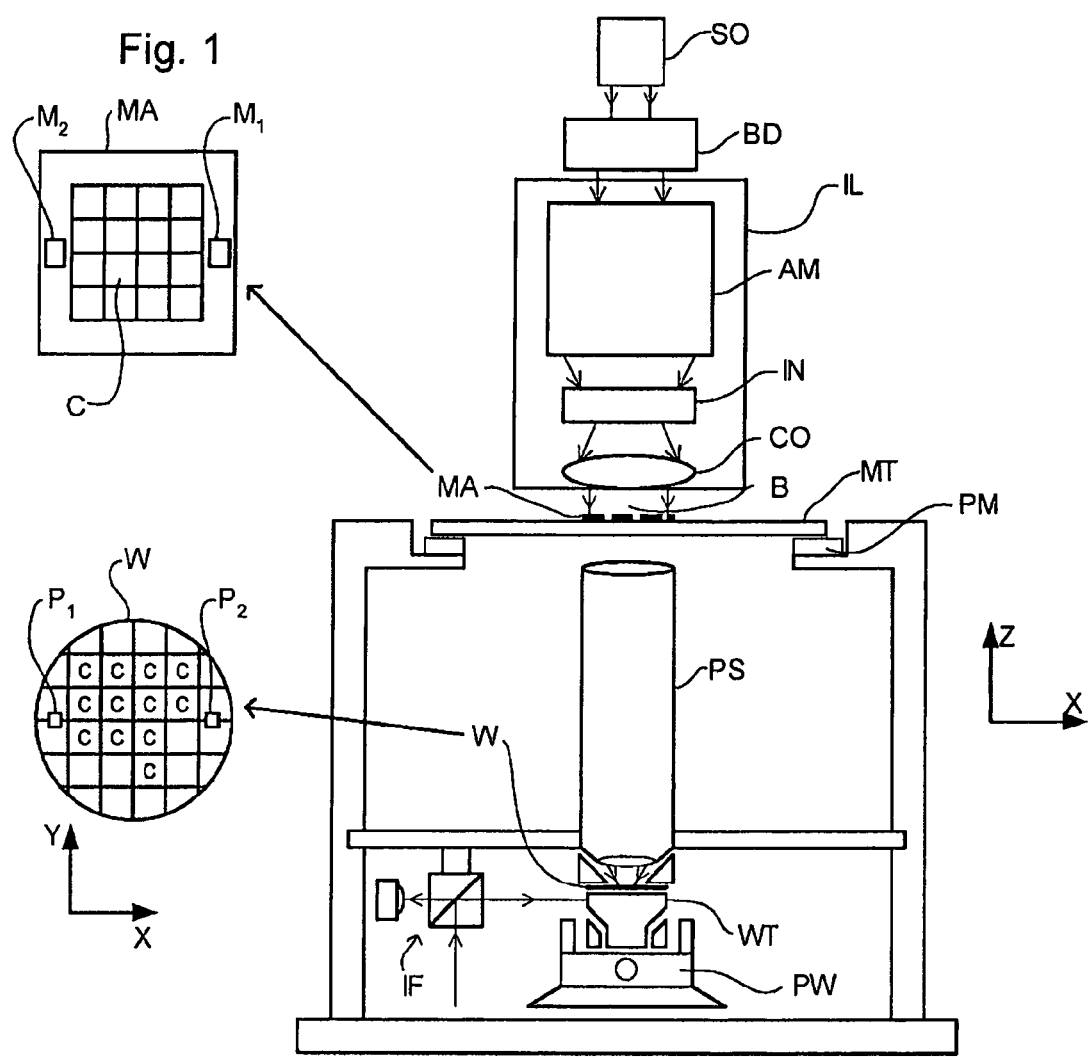
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or DUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as needed. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if needed, may be referred to as a radiation system.

The illuminator IL may comprise an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as needed after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

One or more embodiments of the present invention are applicable to all types of liquid supply system which have a speed at which the liquid can no longer be contained. In particular those types which contain the liquid in a volume above the substrate and which at least partly rely on capillary force and/or an underpressure and/or gas pressure and/or hydrodynamic force and/or friction between the liquid and the substrate, etc. to ensure that liquid does not substantially escape that volume. Examples of such liquid supply systems are illustrated in FIGS. 2-6 although one or more other or additional types of liquid supply systems may also make use of one or more embodiments of the present invention, including those which use a gas knife to contain the liquid, e.g. as depicted in FIG. 5.

FIG. 6 schematically illustrates a substrate table WT that supports a substrate W. The substrate table is provided with one or more conditioning channels 101 that form part of a schematically depicted conditioning system 100. The conditioning system 100 comprises a conditioning fluid supply device 102 configured to transport the conditioning fluid to the substrate table WT. The conditioning system 100 further comprises a conditioning fluid removal device 103 configured to transport the conditioning fluid away from the substrate table WT. The temperature of the conditioning fluid is controlled such that the temperature of the substrate table WT stays substantially constant. The fluid may be gas (e.g. air) or liquid (e.g. water).

As indicated above, one of the challenges of immersion lithography is the thermal conditioning of the substrate W. Evaporation of residual liquid on the surface of the substrate W may result in a thermal load applied on the substrate W and substrate table WT. More specifically, evaporation of residual liquid may extract heat from the substrate W and substrate table WT that in turn may result in a substrate shape deformation due to temperature changes of the substrate or due to deformation of the substrate table on which the substrate is held, because the substrate W is held firmly onto the substrate table WT. As a solution, active cooling of the substrate table WT may be used to compensate for the heat load. For this purpose, the substrate table WT is provided with the one or more conditioning channels 101 that transport a conditioning fluid through the substrate table WT. Such a channel is supplied with conditioning fluid by means of a supply device that transports conditioning fluid to the conditioned substrate table. Fluid may be transported away from the conditioned substrate table by means of a removal device.

During operation of the lithographic apparatus, the substrate table WT is accelerated and consequently the conditioning fluid, inside the supply device (which is usually formed as a (flexible) hose), the removal device (which also is usually formed as a (flexible) hose), and/or the substrate table WT, experiences an acceleration and consequently a change in fluid pressure. This change in pressure in the conditioning fluid is directly transferred to the conditioning channel 101 in the substrate table and thus to the substrate table.

Fluid, and in particular water, cooling of the substrate table WT is thermally beneficial. However, fluctuation of the (absolute) pressure of the conditioning fluid directly acts on the substrate table and may cause it to deform, if only slightly, whereby the deforming substrate table WT may transfer its deformation directly to the substrate W it supports. This may negatively impact the overlay and focus stability of the lithographic apparatus. Parameters that determine the sensitivity of the substrate table WT to this deformation include the stiffness of the substrate table, the contact stiffness of the substrate, the conditioning channel layout, etc.

The pressure fluctuation may be caused by a number of mechanisms in addition to or other than acceleration of the substrate table WT, for example a flow induced vibration caused by local flow turbulences in the conditioning fluid circulating in the conditioning channel 101 and by rotating equipment (e.g., pumps) in the conditioning fluid supply infrastructure.

The first mechanism, acceleration, may be however the largest contributor. As an indication of the effect of pressure variation in the conditioning fluid on the lithographic apparatus, an overlay penalty on an immersion system related to conditioning fluid pressure fluctuation may be up to 5 nm.

The conditioning system 100 as depicted in FIG. 6 further comprises two pressure dampers 104, 105 in the form of expansion tanks. The first pressure damper 104 is in fluid communication with the supply device (e.g., hose) 102. The second pressure damper 105 is in fluid communication with the removal device (e.g., hose) 103. The first pressure damper 104 comprises a housing 104A that has a first compartment 104B and a second compartment 104C. The first compartment 104B is connected to the fluid supply device 102. The second compartment 104C is separated from the first compartment 104B by means of a flexible membrane or moveable piston 106 that allows a compressable medium, such as gas, that is contained in the second compartment to expand or contract due to pressure variation in the supply device 102. The second pressure damper 105, which includes a housing 105B, a first compartment 105B, a second compartment 105C, and a flexible membrane or movable piston 106 may be of the same design as the first pressure damper 104 and will not be separately described. In an alternative embodiment, the membrane may be the same, but the volume and/or pressure of gas in the second compartment 104C, 105C may be different.

Depending on the level of pressure variation in the conditioning system one pressure damper may suffice instead of the two pressure dampers as depicted in FIG. 6. The pressure dampers act to isolate the conditioning fluid within the substrate table from the conditioning fluid supply device, resulting in a reduction of the pressure variations.

As to the location of the one or more pressure dampers 104, 105 that are in fluid communication with the conditioning system 100, a position as close as possible to the substrate table 101 may be advantageous. Positioning the one or more pressure dampers 104, 105 inside the carrier (commonly named substrate chuck) that carries the substrate table WT may be advantageous.

From the above it will be understood that by conditioning the substrate table WT the substrate W is also conditioned.

The same damping system may be used on other cooling systems such as those applied to the mask table of an EUV lithographic apparatus or in a packaging tool where there is a large thermal load on the substrate due to laser intensity.

Figure 7:
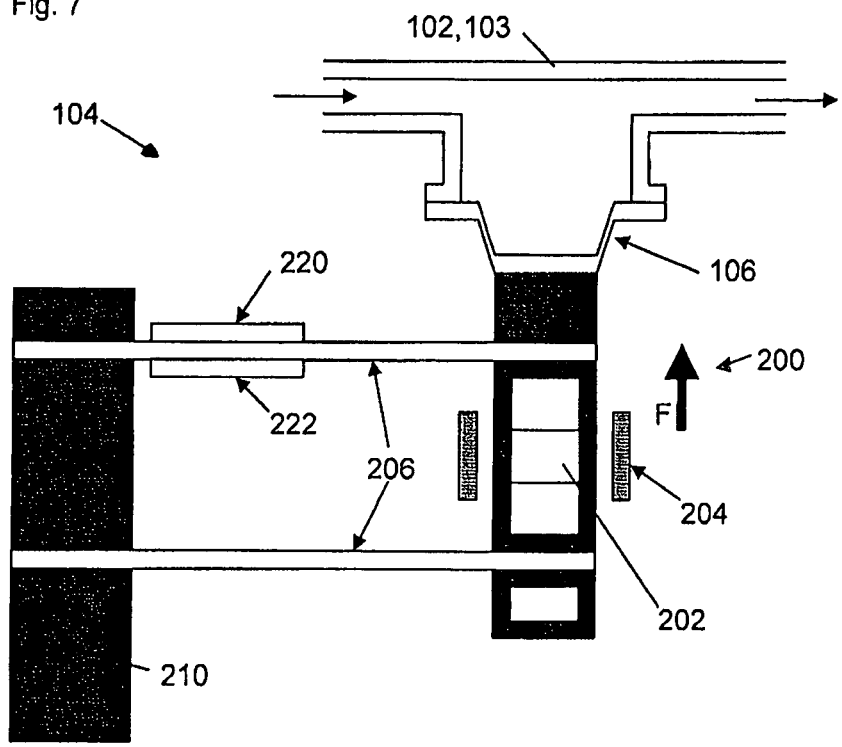
FIG. 7 illustrates schematically, in cross-section, a damper which may be used in an embodiment of the present invention.
Figure 8:
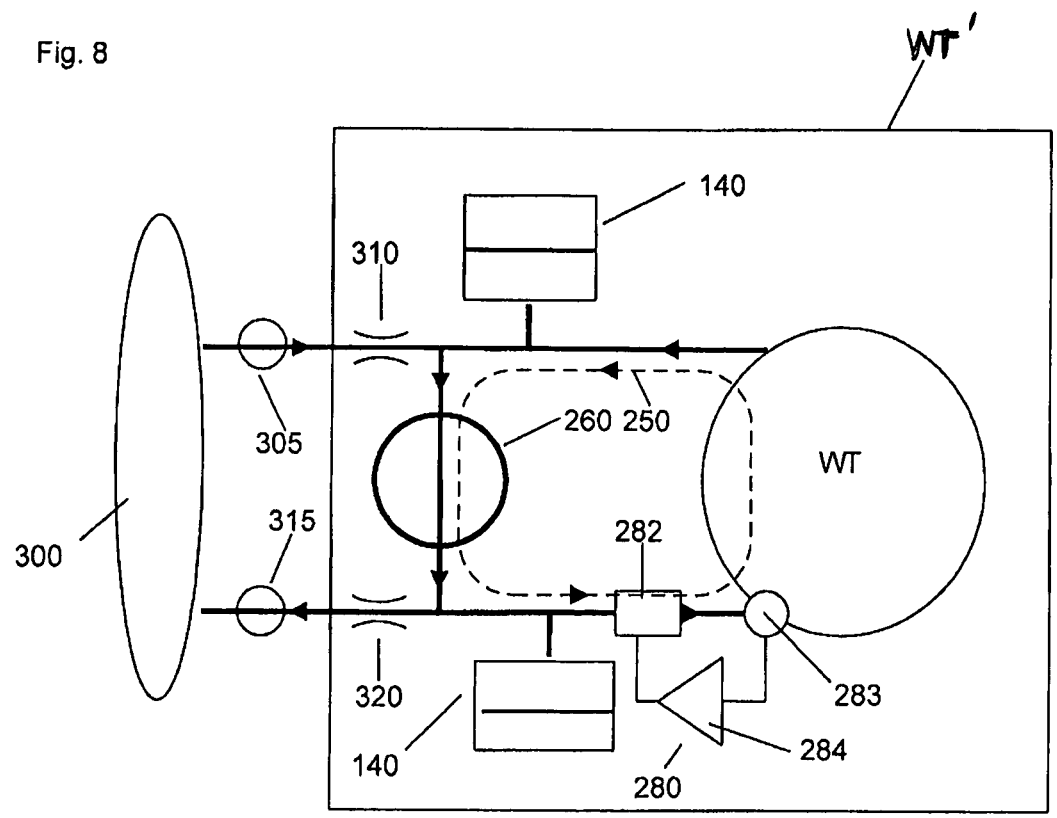
FIG. 8 illustrates schematically, a further embodiment of a conditioning system.

FIG. 7 illustrates a different arrangement of pressure damper 104 which can be used in the embodiment of FIG. 6 (or that of FIG. 8). In the pressure damper 104 of FIG. 7, the flexible membrane or moveable piston 106 is in fluid communication with a line 102, 103 of the conditioning system 100. Thus, the conditioning fluid is in fluid communication, on one side, with the moveable member 106. This is similar to the second compartment 104C of the damper of FIG. 6 in that the one side of the membrane 106 will experience the pressure of the fluid in the conditioning system.

On the other side of the flexible membrane or moveable piston 106 there is attached an actuator 200. The actuator is designed such that it applies, in use, a constant force F to the moveable member 106. The actuator 200 is comprised of permanent magnets 202 in an armature and coils 204. By passing a current through the coils 204 interaction of the magnetic field thereby generated with the magnetic field of the magnets 202 produces the force which is applied to moveable member 106. Leaf springs 206 are provided to provide a biasing force to the armature and are connected to a housing 210 or similar fixation which is rigidly mounted with respect to the conduit 102, 103 in the vicinity of the flexible member 106. Two sensors 220, 222 are provided on the springs 206 for detecting the position of the armature.

Control electronics can be provided which are used to return the actuator to its neutral position. These control electronics receive positional signals from sensors 220, 222 in order to receive information regarding the position of the armature. The armature is then returned to its neutral position at a low frequency (for example at a frequency of below 0.1 Hz The damper of FIG. 7 is an improvement over the damper of FIG. 6 in that there is no air in a first compartment 104B, 105B which can leak out of the damper. Furthermore, the signals output by the sensors 220, 222 can be used to monitor correct operation of the damper unit 200. Furthermore, the damper 104 of FIG. 7 can be engineered relatively small and thereby can be positioned as close as possible to the conditioning system 100 inputs into the substrate table WT. Correct operation of the damper 200 is indicated by the sensors 220, 222 showing changing signals.

As an alternative to the passive type of dampers described above in relation to FIGS. 6 and 7, or in addition to those type of dampers, it is also possible to add an active damper in the conditioning system. Such an active damper is used to apply a positive or negative pressure to the fluid in the conditioning system which is substantially equal in amplitude and opposite in direction to a pressure variation from a pre-determined pressure measured by a sensor. For this purpose, a controller may be provided to drive an actuator of the active pressure damper. Thus, it can be seen that the active pressure damper is driven in an anti-noise manner based on a feed-forward or feed-back system.

In one embodiment, the pressure sensor is upstream (in terms of the path followed by the conditioning fluid) of the substrate table and the active pressure damper is closer to or even on the substrate table. Alternatively or additionally, the sensor may be downstream of the substrate table and the active pressure damper may be in the substrate table. In those two circumstances, the pressure sensor may be in a fluid supply line to the substrate table (upstream) or in a fluid removal line from the substrate table (downstream). In one embodiment, the pressure sensor is comprised of the sensors 220, 222 of FIG. 7.

FIG. 8 illustrates a second embodiment of the conditioning system 100. The embodiment of FIG. 8 incorporates many additional features over what is described above with regard to FIG. 6.

As shown in FIG. 8, there is provided a local loop 250, around which the majority of conditioning liquid flows and which is local to the substrate table WT and/or the carrier of the substrate table WT. In the below description, the substrate table WT and the substrate table carrier (illustrated as a square box WT') in FIG. 8) will be described as one unit.

FIG. 8 also illustrated the use of restrictions 310, 320 in a flow path of the conditioning system. The restrictions 310, 320 may be positioned in the flow path at or adjacent to where the flow path joins the substrate table WT'. The use of these restrictions, in particular in combination with one or more pumps 305, 315 may further reduce pressure fluctuations in the conditioning system.

As can be seen from FIG. 8, this embodiment also incorporates dampers 140, which may be the dampers 104, 105 described above, and indeed any individual components illustrated in any of the embodiments may be used alone or in any combination with any of the other features described herein.

One potential challenge with the conditioning system of FIG. 6 is the large pipes that should be connected to the moving substrate table WT'. The large pipes are used because of the desirability to have a large flow rate of conditioning fluid in order to condition an immersion substrate table WT'. The type of flow rate is of the order of 8 liters/minute. This results in large diameter tubes being connected between a fixed part of the apparatus and the moving substrate table WT'. The embodiment of FIG. 8 avoids the need for such large diameter pipes by re-circulating a majority of conditioning fluid in the substrate table WT' in a loop 250 which is contained entirely within the substrate table WT' with the conditioning fluid being driven around the loop by pump 260 which is mounted to the substrate table WT'.

The recycling pump 260 which is mounted to the substrate table WT' for pumping conditioning fluid around the loop 250 could be driven electrically or alternatively it could be driven mechanically by inertia forces used by the movement of the substrate table WT'. If there is a net heat loss from the substrate table WT' (which may well be the case because of evaporation of immersion liquid from the top surface of the substrate table WT) the conditioning system can comprise a closed loop 250 with no pipes containing conditioning fluid needing to be led to the substrate table from a fixed point. This may be achieved by providing a heating circuit 280 which comprises a heater 282 and a temperature sensor 283 as well as a controller 284 to control the temperature of the conditioning fluid to the desired degree. Indeed, a similar system can be used even if the conditioning fluid is used to reduce the temperature of the substrate table WT. In that case, the heater 282 can be replaced by a cooler such as, for example, a peltier cooler. Even in that case, the dampers 140 may be present in the loop to accommodate pressure changes in the conditioning fluid. The conditioning fluid may even be used to cool the pump 260.

In the case of a positive total heat load, small tubes between a fixed point of the apparatus and the substrate table WT' which allow flow of a small part of conditioning fluid of the conditioning system to be taken to an external cooler 300 is possible. Of course, the external cooler 300 could equally be an external heater or a combination of an external heater and an external cooler. In this way, a flow of only about 2 liters/minute between the external cooler/heater 300 and the substrate table WT' is may be provided, and this can be achieved by tubes of a much smaller diameter than the example of FIG. 6.

Clearly any connection between the fixed world and the moving substrate table WT' (such as the tubes between the heater 300 and the substrate table WT' should include conduits that are flexible/bendable to accommodate movement of the substrate table WT'. This is common to most, if not all immersion systems which use a moving substrate table, because it is not only cooling fluid but also power and electrical signals that need to be transferred to the substrate table. The design of FIG. 8 allows conventional connections to be used because of the relatively low flow rate of conditioning fluid through the tubes. This allows capacity for other services such as gas extraction around the edge of the substrate W to be increased (e.g., up to a level of 80 liters/min).

A slight variation on the embodiment of FIG. 8 is to place part of the components of the loop 250 on a separate carrier to the carrier of the substrate table WT. For example, the pump 260 could be placed on such a separate carrier and conduits could be used to transfer pumped conditioning fluid to the substrate table WT'.

Also utilized in the embodiment of FIG. 8 are flow restrictions 310, 320. These are illustrated on the substrate table WT' in the flow path of conditioning fluid just after where the conditioning fluid is entering the substrate table WT'. Similar flow restrictions may be used in the embodiment of FIG. 6 and indeed they may be more useful in that embodiment where there would be a larger flow through the flow restrictions.

The flow restrictions 310, 320 damp any pressure waves in the conditioning fluid moving towards the substrate table WT'. These have been found to be effective, particularly in combination with the dampers 104. The pump 260 also compensates for pressure drop across the restrictions.

One or both restrictions 310, 320 may be used and these may or may not be used in combination with further pumps 305, 315. In one particular arrangement the restriction 320 at the exit of the conditioning fluid on the substrate table WT' is combined with a single pump 305 which pumps fluid along the pipe through which conditioning fluid enters the substrate table WT'. In a different embodiment the opposite is true; namely the flow restriction 310 is present with pump 315 but pump 305 and restriction 320 are not present. In a further embodiment, pump 315 is present and a restriction is present in place of pump 305 and no further pumps are present (pump 260 is not present and neither is loop 250) such that the pump and restriction are on the stationary side at some distance from the substrate WT'.

In one embodiment, the size of the restriction(s) is(are) adjustable, thereby to provide a way to adjust the pressure of liquid. In yet a further alternative, if only restriction 310 is present, only pump 315 may be present and the pump could be present at the position of the restriction 320 illustrated in FIG. 8 (i.e. mounted to the substrate table WT' at a position where the conditioning fluid exits the substrate table WT'). If the pump 315 or 305 is a positive displacement pump (for example a gear pump or rotary vein pump), it may be effective to "block" the flow path for the conditioning fluid. This may have the advantage that any pressure build-ups in the flow path on one side of the pump will not be transmitted to the other side of the pump. This can be used effectively by using only one of the two pumps 305, 315 or both of the pumps and either mounted on the substrate table WT' or elsewhere, for example mounted on a fixed part of the apparatus. Positive displacement pumps also have a fixed flow which may be advantageous. If a normal pump is used, the flow may increase or decrease during acceleration of the WT because of the inertia of the water in the hoses. This may cause large pressure changes in the substrate table WT for a long time after the acceleration has stopped. By using a positive displacement pump, the pressure peaks during acceleration might be higher, but the system has much lower pressure changes in the constant velocity phase after the acceleration, which is when it is not desirable to have pressure changes.

One type of flow restrictor which could be used is illustrated in FIG. 9. The dimensions given are examples only. Similar types are available from Neoperl GmbH of Klosterrunstraβe 9-11, DE-79379 Müllheim, Germany though these are made of plastic. Metal versions are preferred and these are available from Kobold Instruments Inc.—USA of 1801 Parkway View Drive, Pittsburgh, Pa. 15205. The flow restrictor is a flexible conical membrane with a hole 400 in it. The fluid flow is from left to right (as illustrated) and when the pressure is increased on the left side, this pressure is effective to reduce the size of the central hole and thus reduce the flow. The flow restrictor may allow the system to be more closed (in the same way as positive displacement pumps 305, 315) so that pressure build-ups at the entrance and exit of conditioning fluid to the substrate table WT' can be at least partially blocked. Because the flow is constant behind the flow restrictor, the pressure fluctuations may be removed and can be of no harm to the rest of the system. The flow restrictor may be installed at both the inlet and outlet of the substrate table WT'. In one embodiment, the flow restrictor is positioned directly at the inlet of the substrate table WT'.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

The descriptions above are intended to be illustrative, not limiting. Thus, it will be apparent to one skilled in the art that modifications may be made to the invention as described without departing from the scope of the claims set out below.

What is claimed is:

1. A lithographic apparatus arranged to project a pattern from a patterning device onto a substrate, the lithographic apparatus comprising:
    a movable object;
    a conditioning system configured to hold a conditioning fluid and to condition the object; and
    a pressure damper in fluid communication with the conditioning system and arranged to dampen a pressure variation in the conditioning system and/or isolate the conditioning fluid within said object from conditioning fluid outside of said object, the pressure damper positioned in or on the movable object or in or on a movable carrier.

2. The apparatus of claim 1, wherein the conditioning system comprises a conditioning fluid supply device configured to transport the conditioning fluid to the object.

3. The apparatus of claim 2, wherein the pressure damper is in fluid communication with the supply device.

4. The apparatus of claim 1, wherein the conditioning system comprises a conditioning fluid removal device configured to transport the conditioning fluid away from the object.

5. The apparatus of claim 4, wherein the pressure damper is in fluid communication with the removal device.

6. The apparatus of claim 1, wherein the pressure damper comprises a housing having two compartments separated by a moveable member, wherein one of the compartments is connected to the conditioning system.

7. The apparatus of claim 6, wherein the moveable member is a flexible membrane.

8. The apparatus of claim 6, wherein the moveable member is a moveable piston.

9. The apparatus of claim 6, wherein the other compartment holds a compressible medium.

10. The apparatus of claim 1, wherein said pressure damper comprises:
    a moveable member in fluid communication, on one side, with said conditioning system; and
    an actuator connected to said moveable member and configured to apply a constant force to said moveable member.

11. The apparatus of claim 10, further comprising control electronics configured to return said flexible membrane to a neutral position.

12. The apparatus of claim 11, wherein said control electronics operate at low frequency.

13. The apparatus of claim 12, wherein said frequency is below 0.1 Hz.

14. The apparatus of claim 1, wherein said pressure damper is an active pressure damper and said apparatus comprises:
    a pressure sensor constructed and arranged to measure the pressure of said conditioning fluid, and a controller constructed and arranged to drive said pressure damper on the basis of signals from said pressure sensor, wherein said pressure damper is configured to apply a substantially equal and opposite pressure to a pressure variation measured by said pressure sensor.

15. The apparatus of claim 14, further comprising a passive damper.

16. The apparatus of claim 1, wherein said conditioning system is configured to circulate the conditioning fluid at least partly in a loop around said object without leaving said object.

17. The apparatus of claim 16, wherein said conditioning system comprises a pump mounted to said object or said carrier, said pump being constructed and arranged to pump the conditioning fluid around said loop.

18. The apparatus of claim 16, wherein said conditioning system further comprises a heater mounted to said object or said carrier, said heater being constructed and arranged to condition said conditioning fluid.

19. The apparatus of claim 16, wherein said conditioning system further comprises a first conduit constructed and arranged to add conditioning fluid to said loop from outside of said object, and a second conduit constructed and arranged to remove conditioning fluid from said loop to outside of said object.

20. The apparatus of claim 1, further comprising at least one flow restriction in a flow path of the conditioning fluid in said conditioning system.

21. The apparatus of claim 20, wherein said flow restriction is in a part of said flow path within said object.

22. The apparatus of claim 20, wherein said flow restriction is positioned in said flow path at or adjacent a position at which the conditioning fluid enters and/or exits said object.

23. The apparatus of claim 20, wherein said flow restriction is positioned in a part of said flow path in which the conditioning fluid substantially flows towards said object.

24. The apparatus of claim 20, further comprising a pump configured to pump the conditioning fluid, said pump being positioned in a part of said flow path in which the conditioning fluid substantially flows away from said object.

25. The apparatus of claim 24, wherein said pump is a positive displacement pump.

26. The apparatus of claim 1, further comprising two pumps in a flow path of the conditioning fluid, a first of said two pumps being positioned in said flow path at a position in which the conditioning fluid substantially flows towards said object, and a second of said two pumps being positioned in said flow path at a position in which the conditioning fluid substantially flows away from said object.

27. The apparatus of claim 1, wherein said object is a substrate table configured to hold a substrate or a mask table configured to hold a mask.

28. The apparatus of claim 1, wherein the pressure damper is coupled to a loop entirely contained in said object to dampen the pressure variation and/or isolate the conditioning fluid within said object.

29. A lithographic apparatus comprising:
a projection system configured to project a pattern from a patterning device onto a substrate; and
a movable object comprising a conditioning system configured to condition the object by pumping a conditioning fluid around a loop contained in the object using a pump mounted to the object,
wherein said conditioning system is configured such that a majority of conditioning fluid in said loop is re-circulated within said loop and a minority of conditioning fluid in said loop is removed from said loop for conditioning outside of said object before being returned to said loop.

30. The apparatus of claim 29, further comprising a conditioning fluid conditioner constructed and arranged to change the temperature of said conditioning fluid.

31. The apparatus of claim 30, wherein said conditioning fluid conditioner is a heater mounted to said object.

32. The apparatus of claim 29, wherein said object is said substrate table or a mask table configured to hold a mask.

33. A lithographic apparatus arranged to project a pattern from a patterning device onto a substrate, the lithographic apparatus comprising:
a substrate table configured to hold a substrate;
a moveable object comprising a conditioning system configured to condition the object, wherein said conditioning system comprises an active pressure damper and a pressure sensor for measuring the pressure of said conditioning fluid; and
a controller configured to drive said active pressure damper on the basis of signals from said pressure sensor,
wherein said active pressure damper is configured to apply a substantially equal and opposite pressure to a pressure variation measured by said pressure sensor, the pressure damper positioned in or on the substrate table or in or on a movable carrier.

34. A lithographic apparatus arranged to project a pattern from a patterning device onto a substrate, the lithographic apparatus comprising a projection system to project the pattern onto the substrate, and a movable object comprising a conditioning system configured to condition the object by propagating a conditioning fluid around a flow path in said object, said flow path comprising at least one flow restriction in the object for reducing a flow of the conditioning fluid in the flow path.

35. The apparatus of claim 34, wherein said flow restriction is positioned at or adjacent an entry or exit position at which, in use, conditioning fluid respectively enters or exits said object.

36. The apparatus of claim 34, further comprising at least one pump constructed and arranged to pump conditioning fluid in said flow path, said pump being positioned either (i) in said flow path at a position at which the conditioning fluid substantially flows towards said object, if said flow restriction is in said flow path at a position at which the conditioning fluid substantially flows away from said object, or (ii) in said flow path at a position at which the conditioning fluid substantially flows away from said object, if said flow restriction is in said flow path at a position at which the conditioning fluid substantially flows towards said object.

37. A lithographic apparatus arranged to project a pattern from a patterning device onto a substrate, the lithographic apparatus comprising:
a projection system configured to project the pattern onto the substrate;
a moveable object comprising a conditioning system configured to condition the object by propagating a conditioning fluid through said object; and
two pumps and two flow restrictions in a flow path of conditioning fluid, a first of said two pumps and a first of said two restrictions for reducing a flow of the conditioning fluid in the flow path being positioned in said flow path at a position in which the conditioning fluid substantially flows towards said object, and a second of said two pumps and a second of said two restrictions for reducing the flow of the conditioning fluid in the flow path being positioned in said flow path at a position in which the conditioning fluid substantially flows away from said object.

38. A lithographic apparatus arranged to project a pattern from a patterning device onto a substrate, the lithographic apparatus comprising:

a projection system configured to project the pattern onto the substrate;

a movable object;

a conditioning system configured to hold a conditioning fluid and to condition the object;

a conditioning fluid supply device configured to transport the conditioning fluid to the object;

a conditioning fluid removal device configured to transport the conditioning fluid away from the object;

a first pressure damper in fluid communication with the supply device; and a second pressure damper in fluid communication with the removal device, wherein the pressure dampers are arranged to dampen a pressure variation in the conditioning system and/or isolate the conditioning fluid in said object from the conditioning fluid outside of said object, the pressure dampers positioned in or on the movable object or in or on a movable carrier.

39. A method of manufacturing a device, the method comprising:

projecting a patterned beam of radiation onto a target portion of a substrate;

conditioning a movable table using a conditioning system; and dampening a pressure variation in the conditioning system using a pressure damper positioned in or on the table or in or on a movable carrier.

\* \* \* \* \*

UNITED STATES PATENT AND TRADEMARK OFFICE
CERTIFICATE OF CORRECTION

| | |
|---|---|
| PATENT NO. | : 8,913,228 B2 |
| APPLICATION NO. | : 11/730749 |
| DATED | : December 16, 2014 |
| INVENTOR(S) | : Wijckmans et al. |

It is certified that error appears in the above-identified patent and that said Letters Patent is hereby corrected as shown below:

On title page, item (75), Line 5
  replace "Einhoven (NL)"
  with --Eindhoven (NL)--.

Signed and Sealed this
Fifth Day of May, 2015

Michelle K. Lee
*Director of the United States Patent and Trademark Office*